(12) United States Patent
Fitzpatrick et al.

(10) Patent No.: US 8,711,984 B2
(45) Date of Patent: Apr. 29, 2014

(54) METHODS AND APPARATUS FOR MAP DETECTION WITH REDUCED COMPLEXITY

(75) Inventors: Kelly K. Fitzpatrick, Sudbury, MA (US); Erich F. Haratsch, Bethlehem, PA (US)

(73) Assignee: Agere Systems LLC, Allentown, PA (US)

( * ) Notice: Subject to any disclaimer, the term of this patent is extended or adjusted under 35 U.S.C. 154(b) by 1027 days.

(21) Appl. No.: 12/017,765

(22) Filed: Jan. 22, 2008

(65) Prior Publication Data

US 2009/0185643 A1 Jul. 23, 2009

(51) Int. Cl.
*H04L 27/06* (2006.01)

(52) U.S. Cl.
USPC .......................................... 375/340

(58) Field of Classification Search
USPC .................. 375/316, 340, 341, 346
See application file for complete search history.

(56) References Cited

U.S. PATENT DOCUMENTS

| 7,467,347 | B2 | 12/2008 | Orio | |
| 7,555,070 | B1 * | 6/2009 | Ulriksson et al. | 375/341 |
| 2003/0139927 | A1 | 7/2003 | Gabara et al. | |
| 2004/0044946 | A1 * | 3/2004 | Bickerstaff et al. | 714/792 |
| 2005/0198551 | A1 * | 9/2005 | Rouxel | 714/1 |
| 2007/0116143 | A1 * | 5/2007 | Bjerke et al. | 375/262 |
| 2007/0136649 | A1 | 6/2007 | Seo et al. | |

FOREIGN PATENT DOCUMENTS

| EP | 1 394 953 A2 | 3/2004 |
| EP | 1 850 486 A1 | 10/2007 |

OTHER PUBLICATIONS

Lee et al. Area-Efficient High-Throughput MAP Decoder Architectures, IEEE Transactions on Very Large Scale Integration (VLSI) Systems, vol. 13, No. 8, pp. 921-933, Aug. 2005.
Thomas et al., "Integrated Circuits for Channel Coding in 3G Cellular Mobile Wireless Systems," IEEE Communications Magazine, pp. 150-159 (Aug. 2003).

* cited by examiner

*Primary Examiner* — Kevin M Burd
(74) *Attorney, Agent, or Firm* — Ryan, Mason & Lewis, LLP (57) ABSTRACT

Methods and apparatus are provided for high-speed, low-power, high-performance channel detection. A soft output channel detector is provided that operates at a rate of 1/N and detects N bits per 1/N-rate clock cycle. The channel detector comprises a plurality, D, of MAP detectors operating in parallel, wherein each of the MAP detectors generates N/D log-likelihood ratio values per 1/N-rate clock cycle and wherein at least one of the plurality of MAP detectors constrains each of the bits. The log-likelihood ratio values can be merged to form an output sequence. A single MAP detector is also provided that comprises a forward detector for calculating forward state metrics; a backward detector for calculating backward state metrics; and a current branch detector for calculating a current branch metric, wherein at least two of the forward detector, the backward detector and the current branch detector employ different trellis structures.

21 Claims, 11 Drawing Sheets

METHODS AND APPARATUS FOR MAP DETECTION WITH REDUCED COMPLEXITY

FIELD OF THE INVENTION

The present invention relates generally to equalization, detection and decoding using maximum-a-posteriori (UP) detection techniques.

BACKGROUND OF THE INVENTION

Disk-drives contain a signal-processing chip, often referred to as a "read channel chip," that converts the noisy analog signal from the magnetic recording head into the binary data sequence that is used by the host computer. A major component in a read channel chip is the channel detector. Extremely high-speed read channel chips are required to operate at data rates on the order of 3 GHz. Read channel chips for disk-drives that are used in portable lap-top computers and other battery-operated consumer electronics must be low-power. Since power usage increases with chip area and clock-speed, a good way to achieve low-power and high-throughput is to reduce the clock-rate and process more than one bit at a time with low-complexity signal processing that does not require significant area. Unfortunately, very complex area intensive signal processing is typically required to achieve the bit-error rate requirements for disk-drives.

The analog signal is filtered with an anti-aliasing filter and sampled so that there is one sample per bit. Because the bits are packed very tightly to achieve high storage capacity on the magnetic disk, the received samples have a low signal-to-noise ratio and are typically corrupted by inter-symbol-interference. The channel detector unravels the inter-symbol-interference by representing each possible combination of binary interfering symbols as states in a trellis. Typically, a 16-state trellis with four inter-symbol-interference symbols is required to provide sufficient performance in the channel detector. The area and power of the channel detector increase with the number of states in the trellis.

The binary sequences stored on the disk-drive awe typically encoded with parity codes or error-correction codes that require soft-decisions from the channel detector to decode the sequence with sufficiently low error-rates. There are two main types of soft-output channel detectors. The most common type is a SOVA detector that uses a soft-output Viterbi algorithm (SOVA) to find the path through the trellis with the maximum probability given the received samples, and to calculate a soft-output for each bit along the path. A SOVA detector typically uses a forward stare processor, a path memory, and a soft-output processor. Improved performance can be obtained by a maximum-a-posteriori (MAP) detector that uses a forward state processor, a backward stare processor, and a soft-output processor. Since the backward state processor makes the MAP detector more complex than a SOVA detector, MAP detectors are not typically used. MAP detectors only provide small performance improvements over SOVA detectors and typically require larger chip area and more power. A MAP detector determines which binary value at each bit position has the maximum probability given the received samples, y. For each bit, a MAP detector calculates a log-likelihood ratio, which is the conditional probability that $c_k$ is equal to binary zero (0) divided by the conditional probability that $c_k$ is equal to binary one (1), given the received samples, as follows:

$$Pr(c_k=0|\underline{y})/Pr(c_k=1|\underline{y}).$$

In a Log-MAP detector, the soft-decision is the natural log of the likelihood ratio, and the hard-decision is the sign of the soft-decision. In a Max-Log-Map detector, the soft-decision is the natural log of the probability associated with the maximum probability path with $c_k=0$ minus the natural log of the probability associated with the maximum probability path with $c_k=1$. The Max-Log Map algorithm is a simplification of the Log-Map algorithm, and the difference in performance is typically small.

A MAP detector comprises a forward detector, a current branch metric detector, and a backward detectors. A full-rate forward detector calculates forward state metrics leading to each of the states at time k−1. In most conventional designs, the backward detector calculates backward state metrics starting from a single state with state metric 0 at time k+Q (where Q is the backward detection period) and leading to each of the states at time k, in the backward direction. Another approach is to let all the states at time k+Q have state metrics equal to 0. In a full-rate MAP detector, the current branch step represents the state transitions from time k−1 to time k. In conventional designs, the number of states at time k and k−1 are typically the same. The current bit label $c_k$ is the bit for which the detector is currently calculating a soft-output. The soft-output at time k is generated from combined metrics that are calculated by adding together a forward state metric, a backward state metric and a current branch metric.

In order to keep up with the throughput of emerging magnetic disk drives, a need exists for a high-speed, low-power, high-performance soft-output channel detector. A MAP detector that is smaller than a SOVA detector when implemented at very high-speed, and has better performance is the ideal solution.

SUMMARY OF THE INVENTION

Generally, methods and apparatus are provided for high-speed, low-power, high-performance channel detection. According to one aspect of the invention, a soft output channel detector is provided for processing a received signal and generating a log-likelihood ratio for one or more detected bits. The channel detector operates at a rate of 1/N and detects N bits per 1/N-rate clock cycle. The channel detector comprises a plurality, D, of MAP detectors operating in parallel, wherein each of the MAP detectors generates N/D log-likelihood ratio values per 1/N-rate clock cycle and wherein at least one of the plurality of MAP detectors constrains each of the bits. The log-likelihood ratio values can be merged to form an output sequence.

In one exemplary embodiment, N is four and D is two, and each MAP detector generates two log-likelihood ratio values per quarter-rate clock cycle. One MAP detector constrains two out of four bits and the second MAP detector constrains an additional two out of the four bits. Furthermore, the first MAP detector determines a bit value and log-likelihood ratio value for two out of the four bits and the second MAP detector determines a bit value and log-likelihood ratio value for the remaining two out of four bits. The first and second MAP detectors are offset by two bits and a branch metric input to the second MAP detector is delayed by two bits from the first MAP detectors.

According to another aspect of the invention, a single MAP detector is provided for processing a received signal and generating a log-likelihood ratio for one or more detected bits. The MAP detector comprises a forward detector for calculating forward state metrics; a backward detector for calculating backward state metrics; and a current branch detector for calculating a current branch metric, wherein at least two of the forward detector, the backward detector and the current branch detector employ different trellis structures. The forward and backward detectors can use different trellis structures with some bits not constrained, and wherein each bit used to calculate a label on the current branch is constrained. In one exemplary embodiment, the forward detector uses a four state trellis, the backward detector uses a 4 or 8 state trellis, and substantially all possible 4-bit current branches are constrained in a combined trellis structure.

According to a further aspect of the invention, a complexity of the channel detector can optionally be reduced by removing a dependence on one or more bits. For example, the dependence on one or more bits can be removed by selecting a branch metric with a minimum value for a binary value in a respective position.

A more complete understanding of the present invention, as well as further features and advantages of the present invention, will be obtained by reference to the following detailed description and drawings.

DETAILED DESCRIPTION

The present invention provides a high-speed, low-power, high-performance channel detectors. According to one aspect of the invention, a channel detector is provided that comprises one or more MAP detectors operating in parallel. In the exemplary MAP detectors, the number of bits on a branch is larger than the number of bits in the state. The bits that are not constrained by a state are either selected based on local feedback or selected to minimize the path metric. When a bit is not constrained, the detector trellis structure does not guarantee that there will be both a surviving path with a 1 and a surviving path with a 0 at that time. Therefore, the detector may not be able to calculate a soft-output for that bit. In addition, assuming that 0 is the value on the minimum metric path, if there is a surviving path with a 1 in that position, there is no guarantee that it will be the minimum metric path with a 1. Therefore, the magnitude of the soft-output generated for a bit that is not constrained may be too large. Furthermore, a NP FIR filter may not be able to adapt that bit properly.

In the exemplary parallel MAP detectors, every bit is constrained in at least one of the MAP detectors. A bit is "detected" by a detector that has that bit constrained. The multiple instantiations of the MAP detector are shifted in time so that all the bits are constrained in at least one of the MAP detectors. Each MAP detector calculates soft-outputs for a subset of the bits that are constrained in the detector trellis. Then, the output from all the detectors is merged to form the output sequence.

In one exemplary embodiment, two parallel 4-state MAP detectors are employed at quarter-rate. Each of the parallel detectors generates two soft-outputs per quarter-rate clock cycle, so there are four soft-outputs generated per quarter-rate clock cycle. Each branch represents four bits, and each state represents two bits. An even MAP detector ties down two out of four possible bits, such as bits 0 and 1. An odd detector ties down the remaining two bits, such as bits 2 and 3. The even and odd notation applies when looking at the quarter-rate clock cycle, which is high for the first two bits and low for the last two bits in a 4-bit clock cycle. The even and odd MAP detectors determine the bit values and soft-outputs for the bits that are constrained by the respective detectors.

In another aspect of the present invention, a single MAP detector is employed, where the forward and backward detectors within the MAP detector may use different trellis structures with some bits not constrained, but each bit used to calculate the label on the current branch is constrained. The current bit label $c_k$ is the bit for which the detector is currently calculating a soft-output, and the current branch is the branch that contains that bit label. In one exemplary embodiment, a single MAP detector operates at quarter-rate with four bits represented on each branch, and the forward detector uses a four state trellis, the backward detector uses a 4 or 8 state trellis, and all possible 4-bit current branches are constrained in the combined trellis structure. Four soft-outputs are generated for the 4 bit labels on the current branch.

Channel detectors are often implemented at a half rate using a radix-4 trellis, i.e., there are two bits per branch and four incoming branches for each state. For each state, the state metric is added to four branch metrics to obtain four outgoing path metrics. The four incoming path metrics are compared using six comparators in parallel. A half-rate SOVA is typically smaller than a half-rate MAP detector. However, at quarter-rate, all the known prior implementations of SOVA and MAP detectors with good performance are typically too large to consider for a high-speed, low-cost channel detector. The present invention significantly reduces the complexity of a quarter-rate MAP detector, and increases the speed so that it is close to double that for a half-rate implementation.

Figure 1:
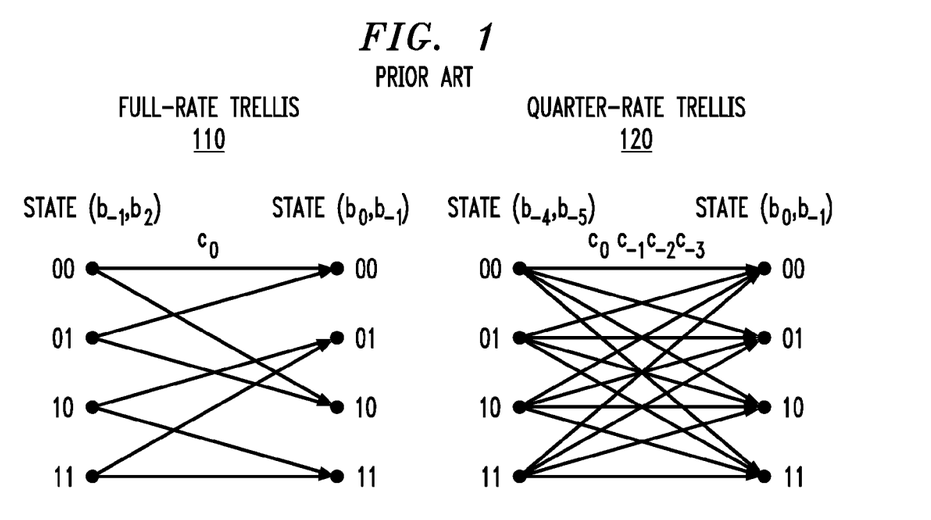
FIG. 1 illustrates a full rate trellis and a quarter-rate trellis.

FIG. 1 illustrates a full rate trellis 110 and a quarter-rate trellis 120. Each state in the quarter-rate trellis 120 has 16 incoming branches, which reduce to four branches after comparing and selecting the best of the parallel branch metrics. The branch label $c_0$ for the full-rate transition from state $[b_{-1}b_{-2}]$ to state $[b_0b_{-1}]$ is usually given by $c_0=b_0$, but may be different if there is precoding. For instance, a $1/(1 \oplus D)$ precoder causes the branch label to be $c_0=b_0 \oplus b_{-1}$, since the detector performs a $(1 \oplus D)$ operation to undo the precoding.

The branch label $(c_0, c_{-1}, c_{-2}, c_{-3})$ for the quarter-rate transition from state $[b_{-4} b_{-5}]$ to state $[b_0 b_{-1}]$ is usually given by $(c_0, c_{-1}, c_{-2}, c_{-3}) = (b_0, b_{-1} b_{-2}, b_{-3})$, but may be different if there is precoding. In a four state trellis, the bits $b_0$ and $b_{-1}$ are constrained by the state and the bits $b_{-2}$ and $b_{-3}$ are not.

Four-Stare Max-Log MAP Algorithm

Figure 2:
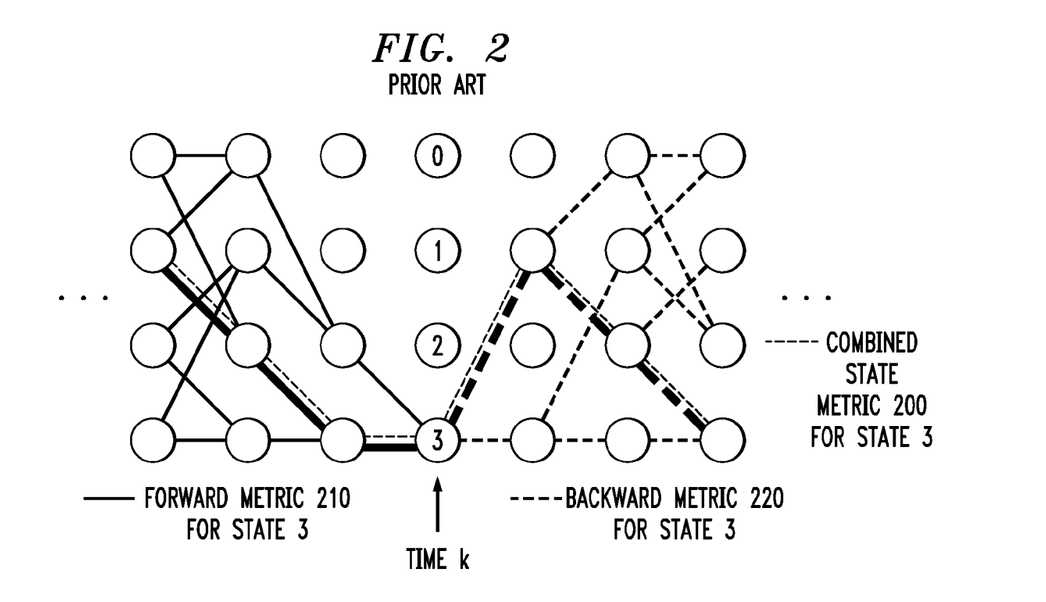
FIG. 2 illustrates the computation of a combined state metric for a best path through state 3 at time k, where the combined metric is given by the sum of a forward state metric and a backward state metric.

As previously indicated, a Max-Log-MAP detector combines forward and backward state metrics to calculate a soft-decision for each bit label. FIG. 2 illustrates the computation of a combined state metric 200 for the best path through state 3 at time k, where the combined metric 200 is given by the sum of the forward state metric 210 and backward state metric 220. In the notation of FIG. 2, the paths associated with the forward state metric 210 are shown as a solid line, the paths associated with the backward state metric 220 are shown as a line of dashed squares, and the paths associated with the combined state metric 200 are shown as a line of dashed circles. A Max-Log Map detector calculates the soft-decision for time k as the difference between the minimum combined metric with a 1 at time k and the minimum combined metric with a 0 at time k.

Figure 3:
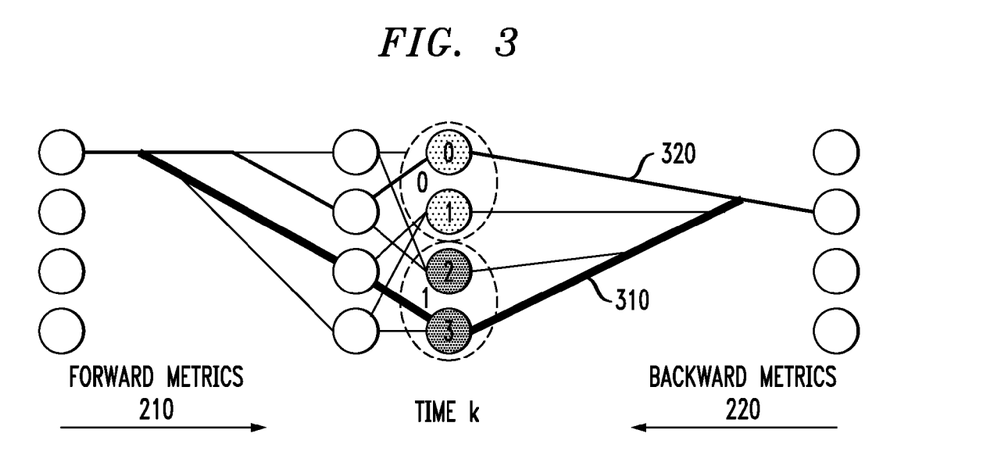
FIG. 3 illustrates the computation of the soft-decision for a bit at time k.

FIG. 3 illustrates the computation of the soft-decision for a bit at time k. As shown in FIG. 3, the soft-decision for a bit at time k is given as the difference between the combined metric 200 for the best path 310 with bit decision one (1) at time k and the combined metric 200 for the best path 320 with bit decision zero (0) at time k. For the 4-state trellis shown in FIG. 1, the soft-decision is given as the minimum of the combined metrics for states 2 and 3 less the minimum of the combined metrics for states 0 and 1.

In one exemplary embodiment of the Max-Log MAP algorithm, the branch metrics that are used to compute forward state metrics are delayed to compute metrics associated with backward processing in the forward direction. Such a Max-Log MAP detector computes combined metrics at time k+Q that correspond to the maximum probability path with bit label 0 at time k and the maximum probability path with bit label 1 at time k. In a Max-Log-MAP detector, the maximum probability path is the same as the minimum metric path. The difference between the two combined metrics is the soft-decision for the bit label at time k. The combined state metrics 200 represent the path metrics at time k+Q for the best paths going through each state at time k. For many applications, Q=8 is sufficient for good error rate performance. This look-ahead method eliminates the warm-up period typically associated with priori backward detectors. All the metrics that are calculated in the backward detector are accurate.

In this particular embodiment, the backward detector is approximately twice the size of the forward detector. The backward detector is implemented in the forward direction as if there are four independent forward detectors associated with each of the states at time k. The forward detector associated with state $S = [b_k b_{k-1}]$ with local feedback $F = b_{k-2}$ starts with state metrics $M_k(b_k\ b_{k-1}\ b_{k-2})$ equal to 0 for $[b_k\ b_{k-1}\ b_{k-2}] = [S, F]$ and equal to infinity for all the other states. The forward detector for state S finds the best path at time k+Q leaving state S at time k. There are 8 forward detectors in the backward detector, one for state S and local feedback F combination. If the number of bits on a branch is large, i.e., 4, the look-ahead length Q is small, i.e., 8, and the number of state and local feedback bits is small, i.e., 4 or 8, then the forward detectors associated with each state can be unraveled so that there are no state metrics that are feedback to generate new state metrics. Since there is no state metric feedback, the backward detector can be pipelined to achieve high-speeds and it does not have to use a single trellis structure to represent each trellis step. Each step can have a different number of states or local feedback.

With conventional designs, the number of bits on a branch is typically small, i.e., 1 or 2, and the number of states at time k is large, i.e., 16. When there are only 1 or 2 bits on each branch, the accurate backward detection period, Q, divided by the number of bits on a branch is large. For a half-rate 16-state MAP detector, there are 4 trellis branch steps associated with the look-ahead period Q=8. The size of an unraveled backward detector would be about 4 times the size of the forward detector. In contrast, the prior-art backward detector that warms-up from a single state is about the same size as the forward detector. When the backward detector uses the same branch metrics as the forward detector, the backward detector cannot use local feedback in the same way that the forward detector does. The local feedback needs to be treated as a state bit. Therefore, one local feedback bit doubles the number of states and two quadruples it. The easiest thing to do is to drop the local feedback and use a backward detector that has worse performance than the forward detector, but has the same number of states. In most conventional detectors, good performance requires 16 states with no local feedback, in which case the backward detector would be approximately the same size as the forward detector. Since conventional forward and backward detectors have the same speed and approximately the same size, there is no incentive to unravel the backward detector to make the backward detector faster and larger. However, the problem with conventional MAP and SOVA detectors is that at half-rate they are unable to achieve high data rates, and a much larger quarter-rate implementation is required.

Figure 4:
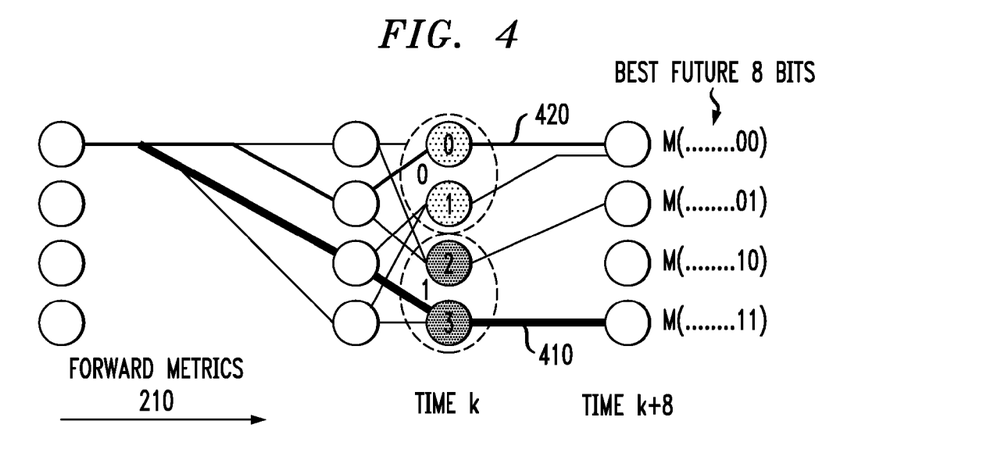
FIG. 4 illustrates the computation of combined state metrics at time k+8 for the best paths going through each particular state at time k.

FIG. 4 illustrates the computation of combined state metrics at time k+8 for the best paths 410, 420 going through each particular state at time k. In order to compute the soft-decision of FIG. 4, conventional techniques employ a 16 state detector with 16 in-bound paths and 16 out-bound paths for each state. The present invention recognizes that substantially similar performance can be obtained using a fewer number of states. In particular, one embodiment of the present invention uses one or more detectors operating in parallel that process four states at high speed in the forward detector, and four or more states in the backward detector. The forward detector has a state metric that is calculated in one quarter-rate clock cycle and feedback for use in the next quarter-rate cycle. An exemplary disclosed MAP detector operates at quarter-rate considering a 4-state trellis 120 with four branches entering each state and four bits per branch as shown in FIG. 1. Preliminary decisions are obtained with typical tracking latency.

The disclosed MAP detector uses only a 4-state trellis in the forward detector, but achieves performance similar to a 16-state detector by using two local feedback taps for the computation of branch metrics. However, in one exemplary implementation, the MAP detector minimizes one local feedback tap out so that only one local feedback tap is required. It has been found that this branch metric computation technique achieves nearly the same performance as the one with two local feedback taps.

As discussed hereinafter, an exemplary MAP detector implements two 4-state modified Max-Log Map detectors that are offset by two bits to generate 4 log-likelihood ratios (LLRs) per quarter-rate cycle. The branch metric input to the odd phase detector is delayed by two from the even phase detector. The even phase detector computes LLR values (and preliminary decisions) for bits $b_0 b_1\ b_4 b_5\ b_8 b_9 \ldots$. The odd phase detector calculates LLR values for bits $b_2 b_3\ b_6 b_7\ b_{10} b_{11} \ldots$.

In a 16-state trellis, each state has four bits. When using a four state trellis to approximate the performance of a 16-state trellis, two bits are obtained from the state label, and two bits are obtained from local feedback to select the branch metrics. Each state has 16 incoming branches, which reduce to four branches after comparing and selecting the best of the parallel branch metrics. The exemplary feedback loop contains an adder to add the state metric to the current branch metric, a 4-way compare and a 4-way select. The exemplary embodiment calculates two sets of 256 (for a total of 512) quarter-rate branch metrics. The branch metrics in the even phase detector can be expressed as $BM_0(b_0b_{-1}b_{-2}b_{-3}[b_{-4}b_{-5}b_{-6}b_{-7}])$ and the branch metrics in the odd phase detector can be expressed as $BM_{-2}(b_{-2}b_{-3}b_{-4}b_{-5}[b_{-6}b_{-7}b_{-8}b_{-9}])$. In one variation, only 256 quarter-rate branch metrics are calculated, reducing the complexity and increasing the speed, by removing the dependence on the last bit ($b_{-7}$ and $b_{-9}$, respectively). As discussed hereinafter, the dependence on the last bit is removed by selecting the branch metric with the minimum value for either binary 0 or 1 in the respective position.

Figure 5:
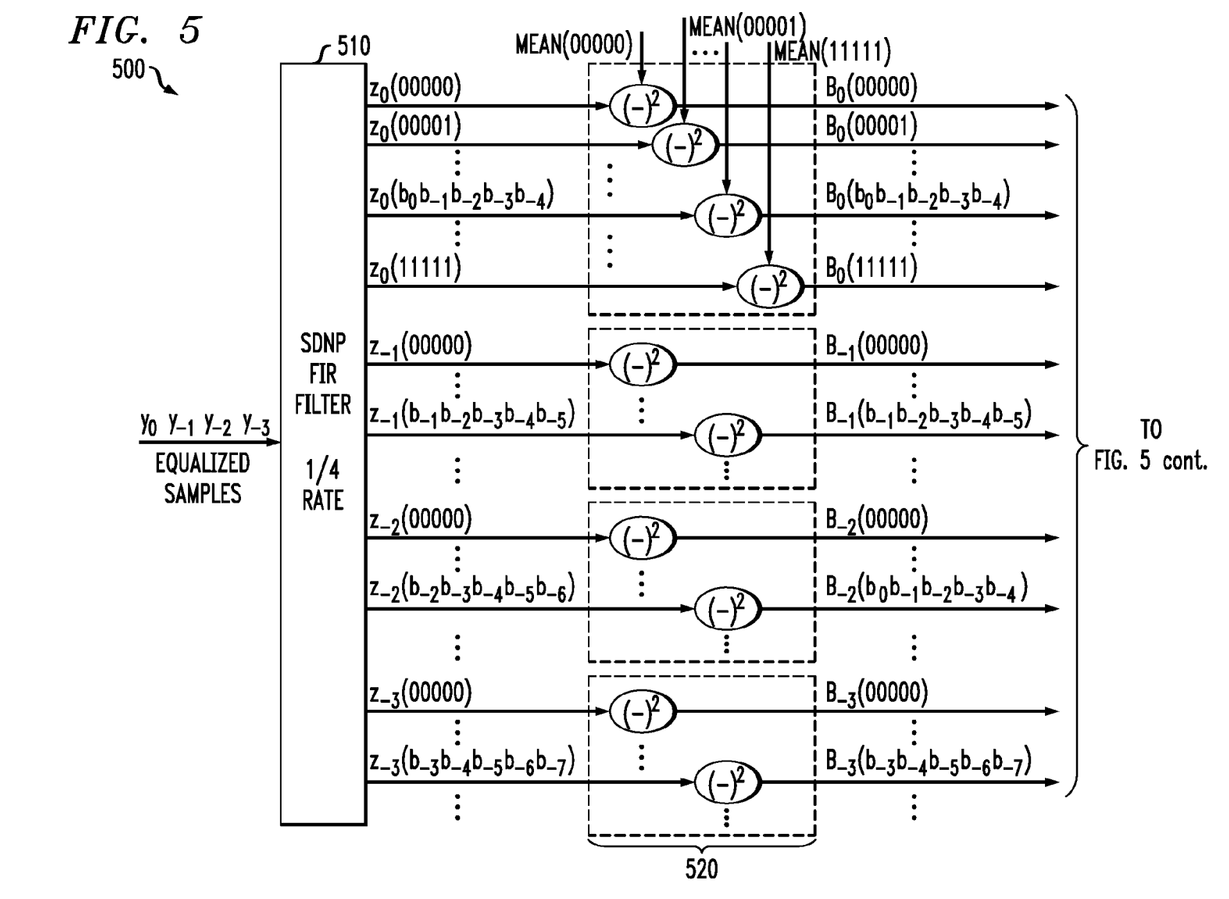
FIG. 5 is a schematic block diagram of a soft input-soft output channel detector incorporating features of the present invention.

FIG. 5 is a schematic block diagram of a soft input-soft output channel detector 500 incorporating features of the present invention. As shown in FIG. 5, the soft input-soft output channel detector 500 processes the equalized samples $y_0y_{-1}y_{-2}y_{-5}$ to calculate the four log-likelihood ratios $L_0$ $L_{-1}L_{-2}L_{-3}$. The soft input-soft output channel detector 500 comprises a signal dependent noise predictive (SDNP) quarter rate FIR filter 510. The waveform read back from the disk is sampled once per bit and equalized with an FIR filter to a partial response target. Since the noise associated with an equalized sample $y_0$ is signal-dependent a set of 32 signal-dependent noise predictive (SDNP) FIR filters 510 are used to generate 32 different filter values $z_0(b_0b_{-1}b_{-2}b_{-3}b_{-4})$, one for each 5-bit signal dependent condition. Typically, a reduced set of signal-dependent conditions are used to reduce complexity. When operating at quarter-rate, the 32 different filtered values for each time interval $t_0$ through $t_{-3}$, such as $z_0(b_0b_{-1}b_{-2}b_{-3}b_{-4})$ for time $t_0$, together with a mean value for the associated filtered value, are then applied to a respective square-difference operator at stage 520.

Generally, the output of stage 520 is the four sets of 32 full rate branch metrics when operating at quarter rate, $B_0(b_0[b_{-1}b_{-2}b_{-3}b_{-4}])$, $B_{-1}(b_{-1}[b_{-2}b_{-3}b_{-4}b_{-5}])$, $B_{-2}(b_{-2}[b_{-2}b_{-3}b_{-4}b_{-5}])$, and $B_{-3}(b_{-3}[b_{-4}b_{-5}b_{-63}b_{-7}])$. The output of the 32 square difference operators associated with time $t_0$ are squared error values, $sqn_0(b_0b_{-1}b_{-2}b_{-3}b_{-4})$. For the correct path, the squared error represents the squared noise associated with equalized sample $y_0$. For incorrect paths, the squared error includes both a noise and a signal component. The square difference operator 520 computes the squared noise value $sqn_0(b_0b_{-1}b_{-2}b_{-3}b_{-4})$ as follows:

$$sqn_0(b_0[b_{-1}b_{-2}b_{-3}b_{-4}])=(z_0(b_0b_{-1}b_{-2}b_{-3}b_{-4})-\text{mean}(b_0b_{-1}b_{-2}b_{-3}b_{-4}))^2$$

where mean $(b_0b_{-1}b_{-2}b_{-3}b_{-4})$ represents the average value of $z_0(b_0b_{-1}b_{-2}b_{-3}b_{-4})$ given that $b_0b_{-1}b_{-2}b_{-3}b_{-4}$ is the correct path. The value of mean$(b_0b_{-1}b_{-2}b_{-3}b_{-4})$ is computed by adding the ideal (noise-less) output for the effective equalization target (combination of the FIR target and the SDNP FIR filter), ideal$(b_0b_{-1}b_{-2}b_{-3}b_{-4})$, and a bias value, bias$(b_0b_{-1}b_{-2}b_{-3}b_{-4})$, that corresponds to the average error between $z_0(b_0b_{-1}b_{-2}b_{-3}b_{-4})$ and ideal$(b_0b_{-1}b_{-2}b_{-3}b_{-4})$ when $b_0b_{-1}b_{-2}b_{-3}b_{-4}$ is the correct path, $$\text{mean}(b_0b_{-1}b_{-2}b_{-3}b_{-4})=\text{ideal}(b_0b_{-1}b_{-2}b_{-3}b_4)+\text{bias}(b_0b_{-1}b_{-2}b_{-3}).$$

In a soft-input/soft-output detector, the soft-input $LI_0$ is added to the squared error to form the full-rate branch metric, according to:

$$B_0(b_0b_{-1}b_{-2}b_{-3}b_{-4})=sqn_0(b_0b_{-1}b_{-2}b_{-3}b_{-4}) \text{ if } c_0=b_0=0$$

$$sqn_0(b_0b_{-1}b_{-2}b_{-3}b_{-4})+LI_0 \text{ if } c_0=b_0=1$$

The 128 full rate branch metrics, B, are applied to a branch metric unit 530 that calculates 512 quarter rate branch metrics, BM, from the 128 full-rate branch metrics and 64 delayed full-rate branch metrics, according to the equation shown within element 530. As used herein, in the notation $BM_0(\underline{0000}[0000])$, the underlined leading zeroes indicate the sum of four fall rate branch metrics for times $t_0$, $t_1$, $t_2$, $t_3$, respectively. As shown in FIG. 5, the minimum of the four parallel branches $BM_0(b_0b_{-1}[b_{-4}b_{-5}b_{-6}b_{-7}])$ 500 is selected and applied to the soft output four-state MAP detectors 540, even detector. Similarly, the minimum of the four parallel branches $BM_{-2}(b_{-2}b_{-3}[b_{-6}b_{-7}b_{-8}b_{-9}])$ 500 is selected and applied to the soft output four-state MAP detectors 550, odd detector. The soft-output Map detectors 540, 550 generate the log-likelihood ratios, L, as discussed further below in conjunction with FIG. 7.

Figure 6:
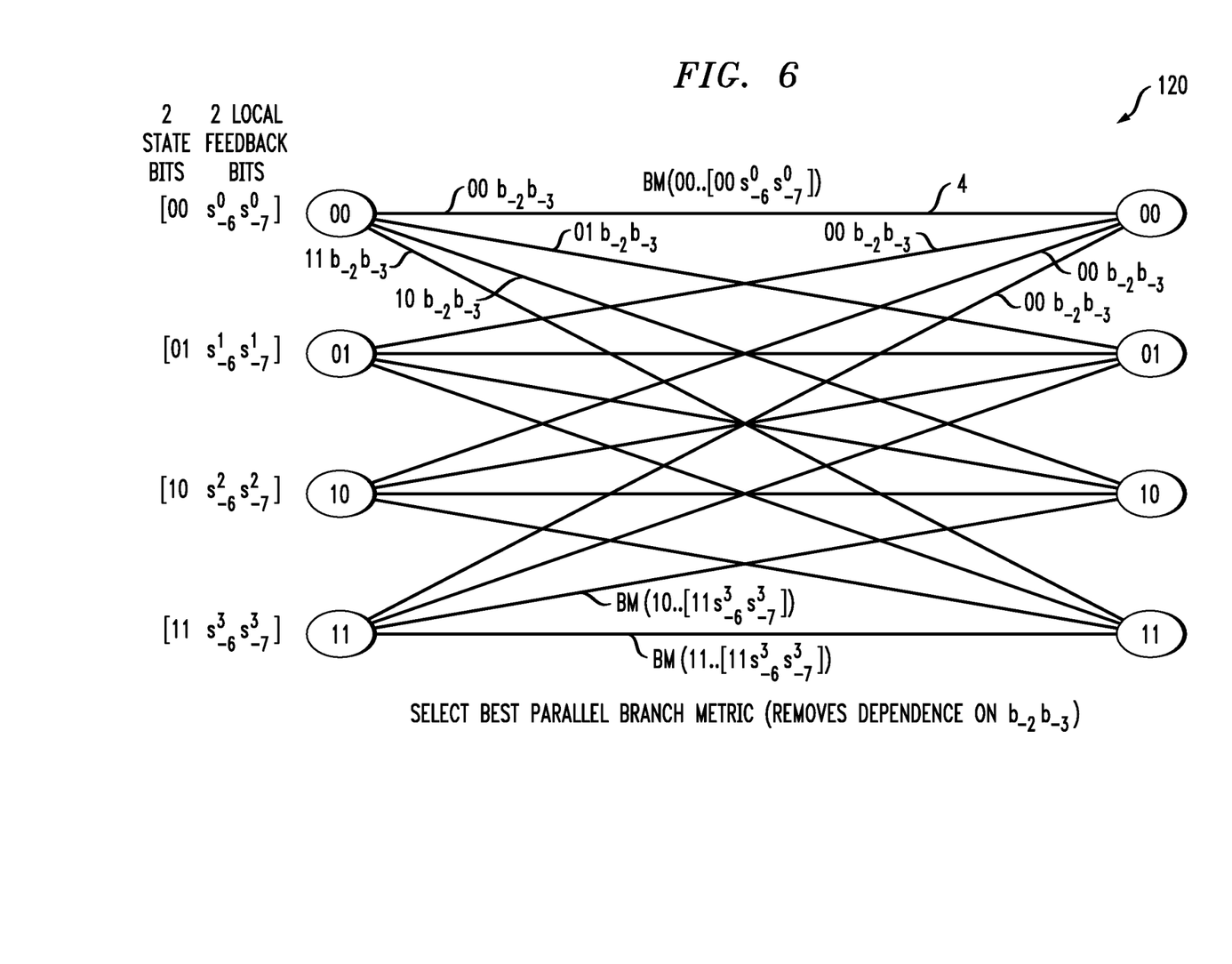
FIG. 6 illustrates the exemplary quarter-rate trellis of FIG. 1 in further detail.

FIG. 6 illustrates the exemplary quarter-rate trellis 120 of FIG. 1 in further detail. It is again noted that the exemplary quarter-rate trellis 120 is a four state trellis, with four sets of four branches into each state, and each branch having four bits. There are thus 16 paths entering each state (4 sets of 4 parallel paths). The parallel branch metrics for each feedback condition are compared and the minimum parallel branch metric is selected that matches the local feedback. The trellis 120 thus reduces to only four incoming paths. In this manner, the critical path is (a 4-way select feedback)/an add/(a 4-way compare)/(a 4-way select) in one quarter-rate clock cycle.

As shown in FIG. 6, the state label associated with each state, such as the state label of the first state $[00\ s^0_{-6}s^0_{-7}]$, comprises two state bits and two local feedback bits. The two local feedback bits are determined by the best path leading to the respective state. The first local feedback bit, for example, $s^0_{-6}$ indicates the bit on the surviving path leading to state 0 at time $t_{-6}$. As discussed further below, one embodiment of the present invention optionally reduces the complexity by removing the second local feedback bit by minimizing it out.

The four bit labels leaving each state, such as $00b_{-2}b_{-3}$, comprise two bits indicating the new state (first two bits) and then two bits that are not constrained by the state (therefore, there are four possible state values). In addition, the branch metric representing the minimum branch metric of the four parallel branches, is denoted by $$BM_0(00\ldots[00s^0_{-6}s^0_{-7}]=\min\{BM_0(0000[00s^0_{-6}s^0_{-7}],\\BM_0(0001[00s^0_{-6}s^0_{-7}],BM_0(0010[00s^0_{-6}s^0_{-7}],\\BM_0(0011[00s^0_{-6}s^0_{-7}]\}$$

The best parallel path (minimum value) is selected to remove the dependency on bits $b_{-2}b_{-3}$. The four bits inside the square brackets represent the historical information of the prior state and local feedback.

Figure 7:
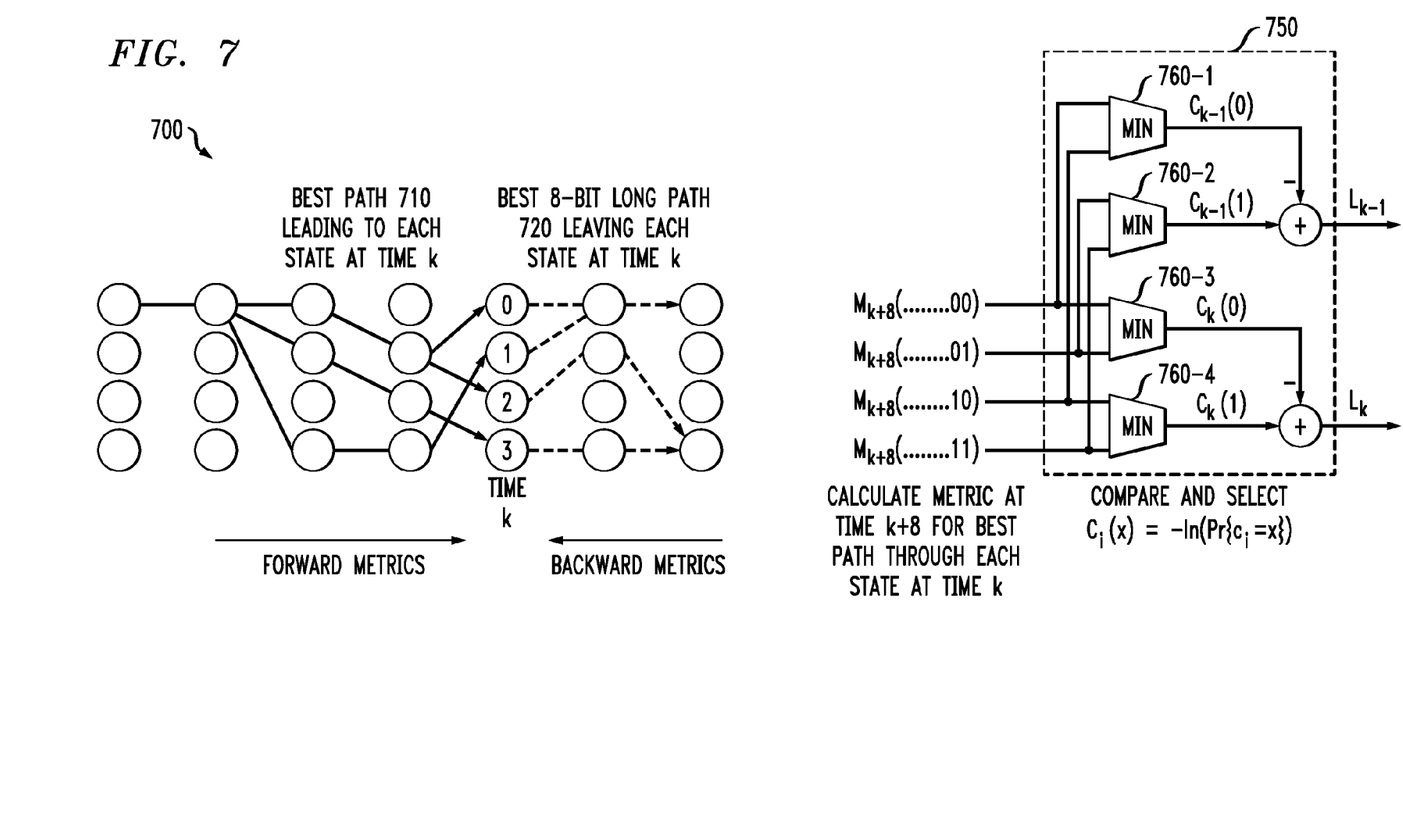
FIG. 7 illustrates a trellis with the best paths (solid lines) leading into each state at time k, and with the best paths (dashed lines) leaving each state at time k (backward processing in the exemplary embodiment is 8-bits long)

FIG. 7 illustrates a trellis 700 with the best paths 710 (solid lines) leading into each state at time k, and with the best paths 720 (dashed lines) leaving each state at time k (backward processing in the exemplary embodiment is 8-bits long). In addition, FIG. 7 illustrates a MAP detector 750 incorporating features of the present invention. The MAP detector 750 processes metrics, $M_{k+8}$, at time k+8 for the best path through each state at time k. Generally, as discussed further below in conjunction with FIG. 8 for a reduced complexity implementation, the metrics, $M_{k+8}$, are the minimum of the sum of all quarter-rate branch metrics, BM, on the best path having the minimum path metric, through state k and going up to time k+8. In the notation of FIG. 7, the first metric $M_k(\ldots 00)$ represents the negative, natural log of the probability of 0 at time k and 0 at k−1, $-\ln\{\Pr(b_k=0 \text{ and } b_{k-1}=0)\}$, where the branch label $c_i=b_i$ for all the exemplary embodiments. The leading dots indicate the binary values k+8 through k+1 that are minimized over to obtain the best path and the trailing zeroes indicate the values for k and k−1 that are constrained.

Comparators 760-1 through 760-4 select the minimum metric. Comparator 760-1 selects the best path having a value of 0 at time k−1. Comparator 760-2 selects the best path having a value of 1 at time k−1. Comparator 760-3 selects the best path having a value of 0 at time k. Comparator 760-4 selects the best path having a value of 1 at time k. Each comparator 760-1 through 760-4 selects, $C_i(x)$, equal to $-\ln(\Pr\{b_i=x\})$. The soft-output of the M detector 750 represents the log-likelihood ratio $L_i$ equal to $\ln(\Pr\{b_i=0\}/\Pr\{b_i=1\})$.

According to one aspect of the invention, the backward processing is unfolded and combined with the forward processing so that both share the same branch metric computations. Backward processing is implemented as a look-ahead to find the best path leaving the state. While the exemplary MAP detector 750 is illustrated as a max-log MAP detector, any type of MAP algorithm can be implemented, as would be apparent to a person of ordinary skill in the art.

Reduced Complexity Approach

In a variation of the present invention, complexity is reduced and speed is increased by feeding back only one of the two local feedback bits, and minimizing out the dependence on the other bit. As used herein, "reduced complexity" means the dependence on the oldest bit (h) is removed by selecting the value of h that minimizes the oldest full-rate branch metric, as follows:

$$BM_0(b_0 b_{-1} b_{-2} b_{-3} [b_{-4} b_{-5} b_{-6} \ldots])$$

where the dependence on bit $b_{-7}$ has been minimized out. The minimum value is selected, with a trade off in reduced complexity at the expense of some lost performance. The complexity of the branch metric calculation block is reduced in half. Thus, only 256 quarter-rate branch metrics are pre-calculated at stage 530 of FIG. 5, as follows:

$$BM_0(b_0 b_{-1} b_{-2} b_{-3} [b_{-4} b_{-5} b_{-6} \ldots]) \text{ and }$$
$$BM_{-2}(b_{-2} b_{-3} b_{-4} b_{-5} [b_{-6} b_{-7} b_{-8} \ldots])$$

Now, when the parallel branch metrics for each feedback condition are compared and the minimum parallel branch metric is selected that matches the local feedback, there are only 64 compare/selections to get:

$$BM_0(b_0 b_{-1} \ldots [b_{-4} b_{-5} b_{-6}]) \text{ and } BM_{-2}(b_{-2} b_{-3} \ldots [b_{-5} b_{-7} b_{-8}])$$

Finally, the 32 quarter-rate branch metrics (16 to each of the even and odd MAP detectors 750) are selected to feed to the channel detector, as follows:

$$BM_0(b_0 b_1 \ldots [b_{-4} b_{-5} \ldots]) = BM_0(b_0 b_{-1} \ldots$$
$$[b_{-4} b_{-5} 1 \ldots]) \text{ if } s^{b-4\,b-5}{}_{-6}=1 \; BM_0(b_0 b_1 \ldots$$
$$[b_{-4} b_{-5} 0 \ldots]) \text{ if } s^{b-4\,b-5}{}_{-6}=0$$

and $$BM_{-2}(b_{-2} b_{-3} \ldots [b_{-6} b_{-7} \ldots]) = BM_2(b_{-2} b_{-3} \ldots$$
$$[b_{-6} b_{-7} 1 \ldots]) \text{ if } s^{b-6\,b-7}{}_{-8}=1 \; BM_{-2}(b_{-2} b_{-3} \ldots$$
$$[b_{-6} b_{-7} 0 \ldots]) \text{ if } s^{b-6\,b-7}{}_{-8}=0$$

$BM_0(b_0 b_{-1} \ldots [b_{-4} b_{-5} \ldots])$ indicates the branch metric associated with a transition from state at time −4 to the state at time 0 that is added to the state metric $M(b_{-4} b_{-5})$. The selection signal, s, controls a corresponding multiplexer as discussed further below in conjunction with FIG. 8. For example, if the selection signal, $s_{-6}$, is a binary one (1), the multiplexer will select the value of 1 in bit position $b_{-6}$, and if the selection signal, $s_{-6}$, is a binary zero (0), the multiplexer will select the value of 0 in bit position $b_{-6}$.

Figure 8:
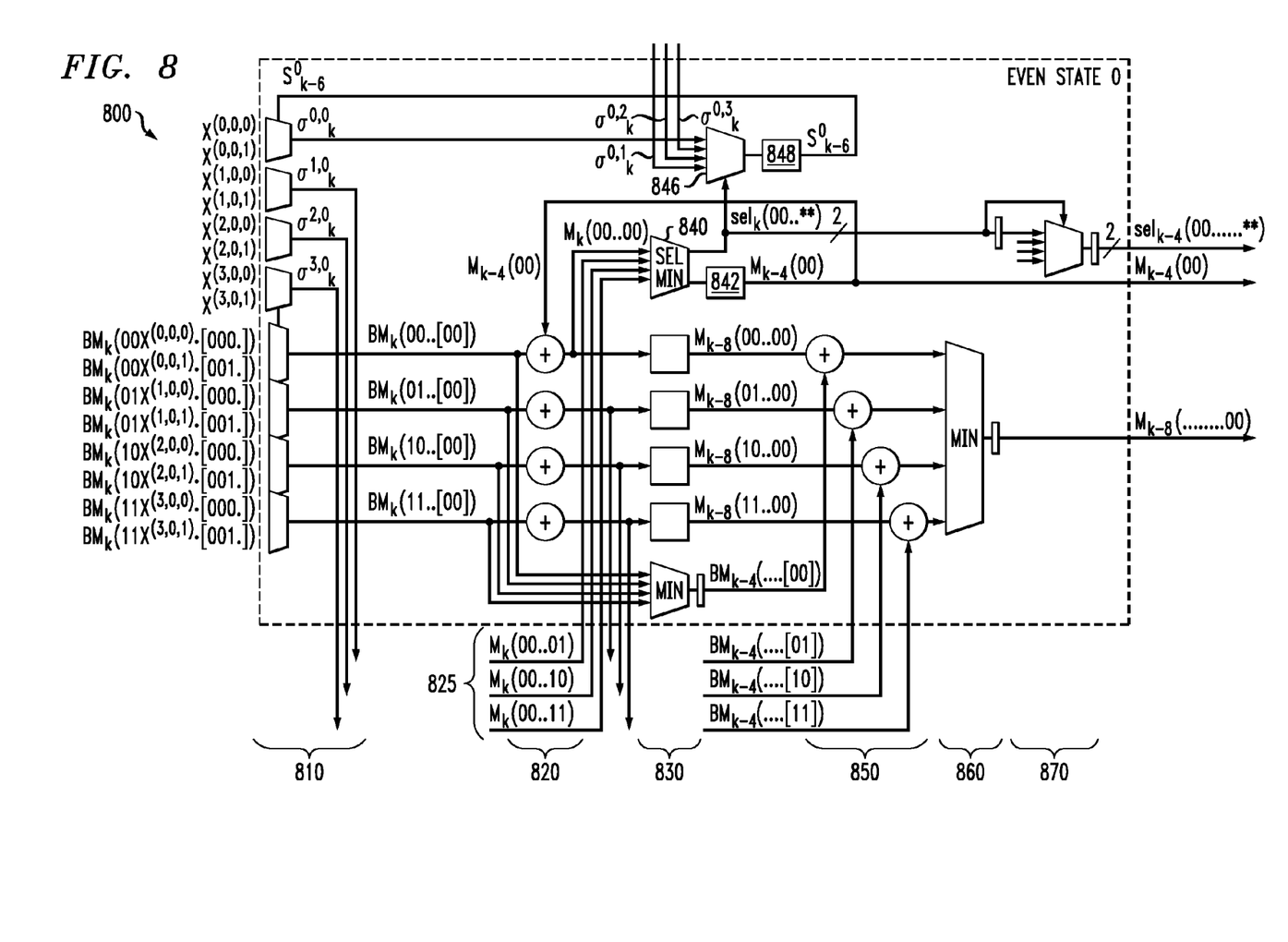
FIG. 8 is a schematic block diagram of an add-compare select-look ahead block 800 for an exemplary state 0 in the even detector of FIG. 5.

FIG. 8 is a schematic block diagram of an add-compare select-look ahead block 800 for an exemplary state 0 in the even detector 540 of FIG. 5. Since there are four states in each of the exemplary even and odd detectors 540, 550, there are a total of eight blocks 800. The four upper multiplexers at stage 810 are controlled by the local feedback selection signal, $s^0_{k-6}$, representing the third most recent bit on the survivor path leading to state 0 at time k−4, also denoted $s^{SI}_{k-6}=Sel_{k-6}(b_{k-4} b_{k-5})$ for initial state $S_1=[b_{k-4} b_{k-5}]$. The output of the multiplexer is the third most recent bit on the best path connecting state $[b_{k-4} b_{k-5}]=0$ with a future state $S_F=[b_k b_{k-1}]$, $\sigma^{S_F 0}_{k}=Sel_{k-6}(b_{k-4} b_{k-5} \ldots b_{k-4} b_{k-5})$. The input to the multiplexer is the third most recent bit on the best path connecting state 0 with a future state that is also constrained to have a specified feedback bit value $F=b_{k-6}$, $X^{(S_F S_F)}=Sel_{k-2}(b_k b_{k-1} \ldots b_{k-4} b_{k-5} b_{k-6})$.

As previously indicated, the four lower multiplexers at stage 810 are controlled by selection signal, $s^0_{k-6}$, to select one of the branch metrics having the appropriate value in the k−6 position. The outputs of the four lower multiplexers at stage 810 are the four branch metrics leaving state 0. The adders at stage 820 add the four branch metrics leaving state 0 with $M_{k-4}(00)$, the best path leading up to state 0 at time k−4. The sums are the path metrics $M_k(00 \ldots 00)$. The additional path metrics 825 are calculated in other state blocks for branch metrics leaving states 1, 2, 3.

The path metrics $M_k(00 \ldots 00)$, $M_k(01 \ldots 00)$, $M_k(10 \ldots 00)$ and $M_k(11 \ldots 00)$ generated by the adders 820 are delayed at stage 830 by twice the 4T quarter rate to obtain the $M_{k-8}$ values for backwards processing. In this manner, the block 800 allows circuitry to be shared and reused by the forward and backward processing. In addition, a multiplexer at stage 830 compares the four branch metrics leaving state 0 and selects the best one (minimum value) to and then delay it by 4T to obtain $BM_{k-4}(\ldots [00])$, the best branch metric leaving state 0. It is noted that in the notation $BM_{k-4}(\ldots [00])$, the values inside the square brackets are tied down at times k−8 and k−9.

The adders at stage 850 add the values at times k−8 and k−9 which are tied down. In addition, the multiplexer 840 at stage 850 compares the four path metrics $M_k(00 \ldots 00)$, $M_k(01 \ldots 00)$, $M_k(10 \ldots 00)$ and $M_k(11 \ldots 00)$ entering state 0 (and generated by the adders 820) and selects the minimum value which is then delayed by 4T at delay 842 to generate the state metric $M_{k-4}(00)$. The selection signal $s^0_{k-6}$ is selected by multiplexer 846 under control of the selected state metric and delayed by 4T at delay 848. The minimum combined metric $M_{k-8}(\ldots 00)$ for state 0 through state 0 eight time periods ago (k−8) is selected by a multiplexer at stage 860 and then delayed by 4T. A selection signal for time k−4, $sel_{k-4}$, is generated by a delay and multiplexer stage 870.

Figure 9:
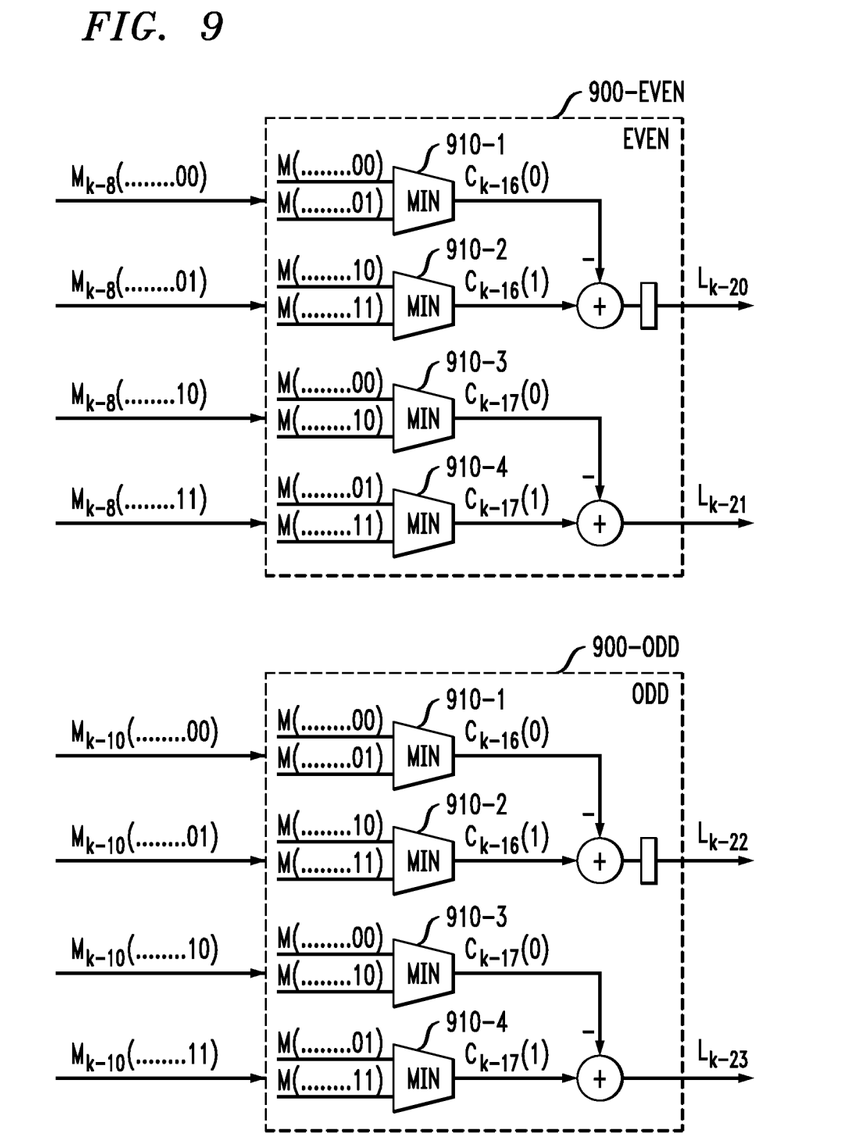
FIG. 9 illustrates even and odd circuits for generating the soft outputs (log-likelihood ratios)

FIG. 9 illustrates even and odd circuits 900 for generating the soft outputs (log-likelihood ratios). As shown in FIG. 9, the first combined metric, $M_{k-8}(\ldots 00)$, is obtained from the detector 800 of FIG. 8 and the remaining seven combined metrics are obtained from similar detectors. Comparators 910-1 through 910-4 select the minimum metric. Comparator 910-1 selects the best path having a value of 0 at time k−16. Comparator 910-2 selects the best path having a value of 1 at time k−16. Comparator 910-3 selects the best path having a value of 0 at time k−17. Comparator 910-4 selects the best path having a value of 1 at time k−17. The output of the adders are then delayed by 4T to provide the log-likelihood ratios for time k−16.

Single Detector Approach

Another embodiment of the present invention involves a single MAP detector with three parts: a forward detector, a current branch metric, and a backward detector; where all three parts may have different trellis structures (i.e, different number of states and/or different local feedback) In this embodiment, the forward trellis and backward trellis structures do not constrain all the bits, and the current branch constrains all the current branch bits. In order to guarantee that the soft-output for the current branch labels is calculated accurately, the combination of the three parts constrains all the bits that are needed to calculate the labels on the current branch.

Figure 10:
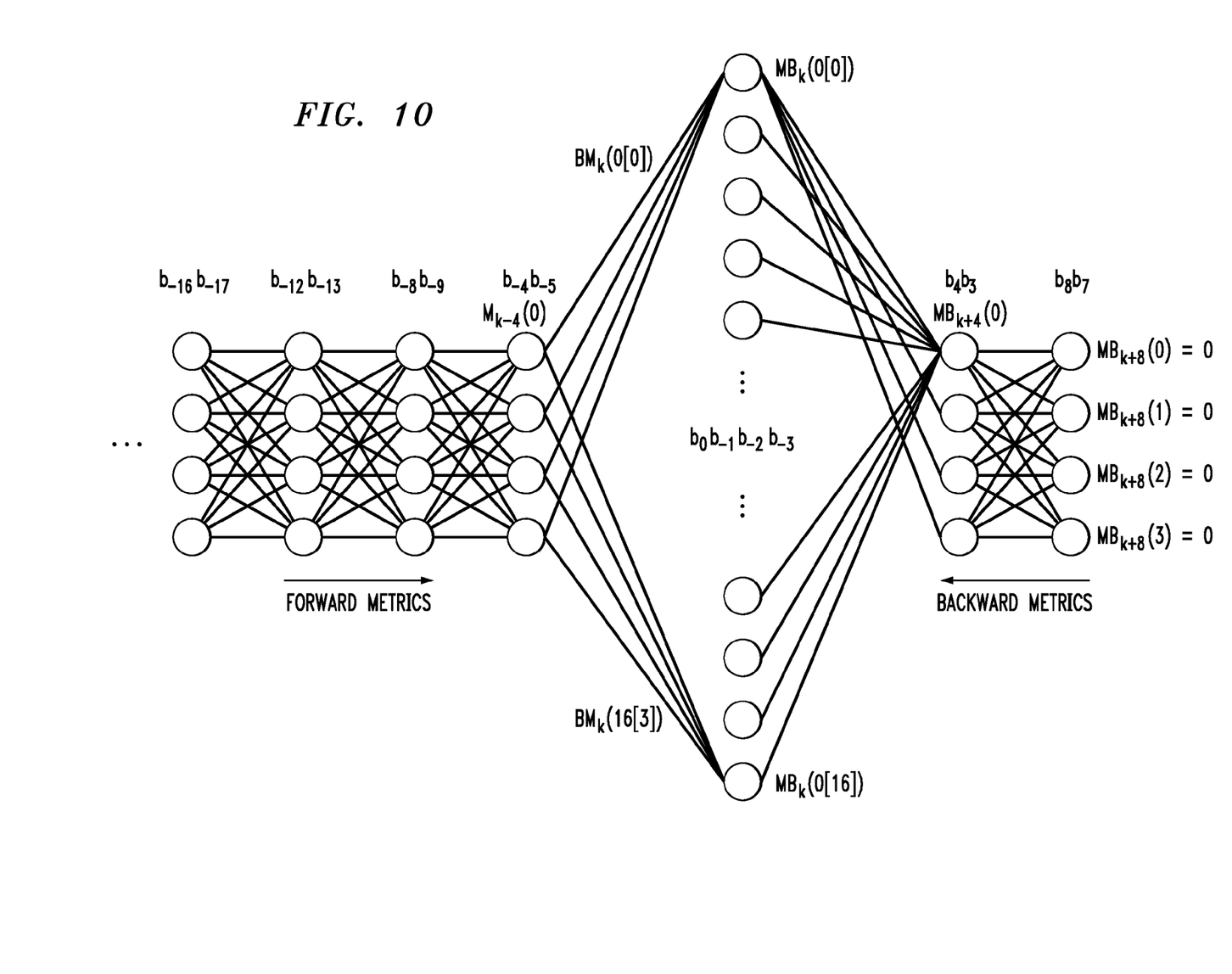
FIG. 10 shows the combined trellis structure associated with time k for a single quarter-rate MAP detector with four states in the forward and backward detectors and 16 states leaving the current branch.

FIG. 10 shows the combined trellis structure associated with time k for a single quarter-rate MAP detector with four states in the forward and backward detectors and 16 states leaving the current branch. FIG. 10 only attempts to show some of the branch connections associated with the 16 states at time k, which each have four incoming paths and four out-going paths. The states at time k+4 have 16 incoming paths and four out-going paths.

Figure 11:
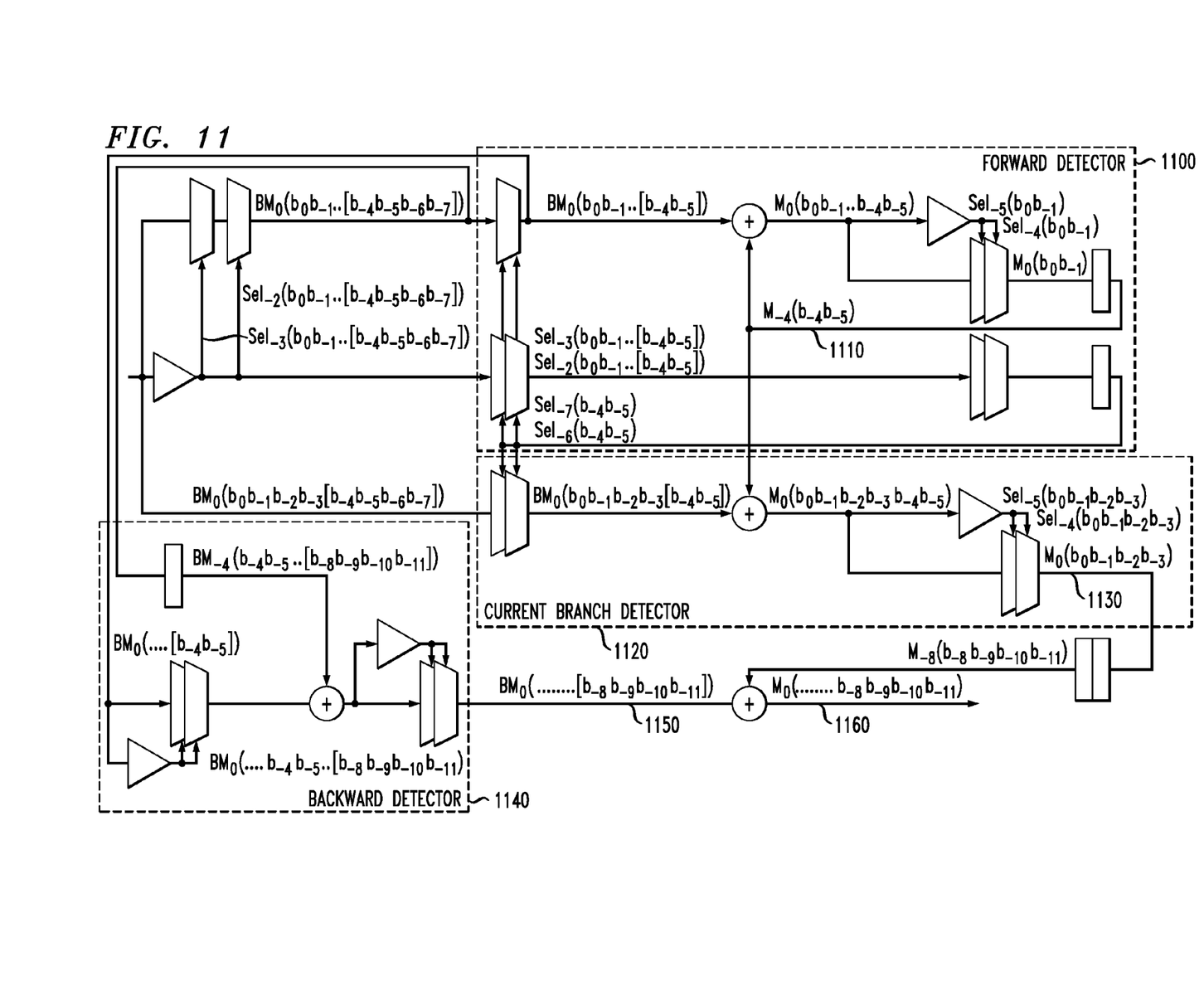
FIG. 11 describes an embodiment of a detector that uses the trellis structure in FIG. 10.

FIG. 11 describes an embodiment of a detector that uses the trellis structure in FIG. 10. There are 4 states with two local feedback bits in the forward detector. The forward detector 1100 updates four forward state metrics $M_k(b_k b_{k-1})$ 1110 by selecting the minimum of:

$$M_k(b_k b_{k-1} \ldots b_{k-4} b_{k-5}) = BM_k(b_k b_{-1} \ldots [b_{k-4} b_{k-5} b_{k-6} b_{k-7}]) + M_{k-4}(b_{k-4} b_{k-5}),$$

where the local feedback is selected by the survivor paths in the forward detector, $b_{k-6} = Sel_{k-6}[b_{k-4} b_{k-5}]$ and $b_{k-7} = Sel_{k-7}[b_{k-4} b_{k-5}]$. There are four bits associated with the current branch and future state fox the current branch $(b_k b_{k-1} b_{k-2} b_{k-3})$ and there are four bits associated with the initial state $[b_{k-4} b_{k-5}]$ and local feedback $[b_{k-6} b_{k-7}]$. The current branch detector 1120 adds the branch metric for the current branch, $BM_k(b_k b_{k-1} b_{k-2} b_{k-4} [b_{k-4} b_{k-5} b_{k-6} b_{k-7}])$ with selected local feedback $b_{k-6} = Sel_{k-6}[b_{k-4} b_{k-5}]$ and $b_{k-7} = Sel_{k-7}[b_{k-4} b_{k-5}]$, to the forward state metric $M_{k-4}(b_{k-4} b_{k-5})$ to generate a current metric $M_k(b_k b_{k-1} b_{k-2} b_{k-3})$ 1130. Ideally, there would be 8 or 16 states in the backward detector, due to the local feedback. However, in this particular embodiment the backward detector has reduced performance and complexity. The backward detector has 4 states with no local feedback everywhere except on the state connected to the current branch, which has 4 state bits $[b_k b_{k-1} b_{k-2} b_{k-3}]$. The dependence on local feedback is removed by selecting the values that minimize the branch metrics. The backward detector 1140 calculates a look-ahead branch metric $B_k(\ldots [b_k b_{k-1} b_{k-2} b_{k-3}])$ 1150 that represents the best 8-bit branch leaving state $[b_k b_{k-1} b_{k-2} b_{k-3}]$. The look-ahead branch metric is calculated by selecting the minimum 4-bit look-ahead branch metric leaving state $[b_{k+4} b_{k+3}]$, adding it to the minimum branch metric associated with the transition from state $[b_k b_{k-1} b_{k-2} b_{k-3}]$ to state $[b_{k+4} b_{k+3}]$, and minimizing over the dependence on the connecting state bits:

$$B_k(\ldots [b_k b_{k-1} b_{k-2} b_{k-3}]) = \min \text{ over } b_{k+4} b_{k+3}$$
$$\{B_{k+8}(\ldots [b_{k+4} b_{k+3}]) + B_{k+4}(b_{k+4} b_{k+3} \ldots [b_k b_{k-1} b_{k-2} b_{k-3}])\}$$

Figure 12:
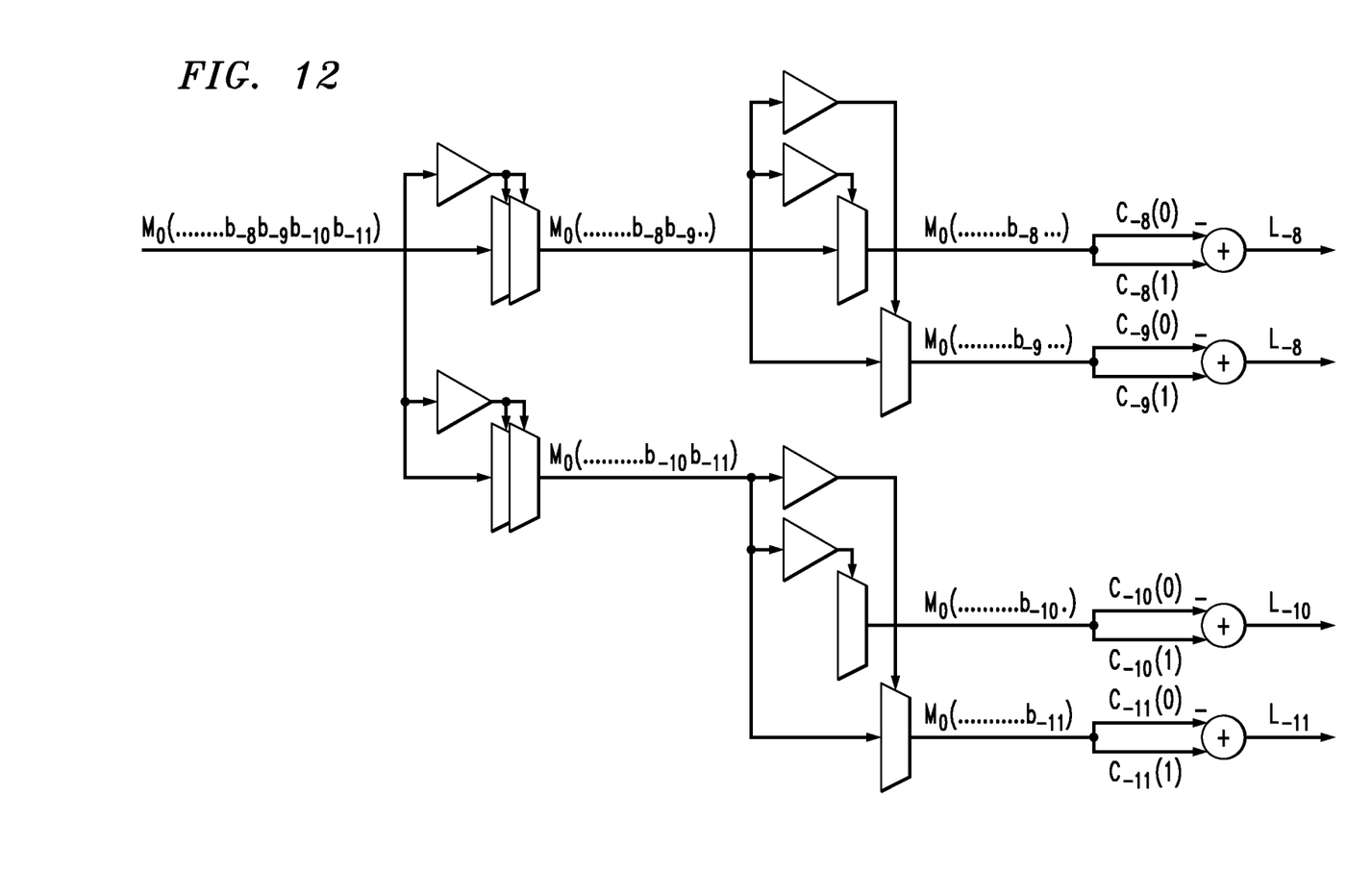
FIG. 12 illustrates the computation of the soft-outputs (log-likelihood ratios).

Then, the look-ahead branch metric is added to a delayed version of the current metric to obtain the combined metric $M_k(\ldots b_k b_{k-1} b_{k-2} b_{k-3})$ 1160 FIG. 12 shows how the combined metric is broken down into two metrics $M_k(\ldots b_k b_{k-1})$ and $M_k(\ldots b_{k-3} b_{k-4})$ as intermediate steps in calculating $C_i(x) = -\ln(Pr\{b_i = x\})$ and the soft-outputs $$L_i = \ln(Pr\{b_i = 1\}) - \ln(Pr\{b_i = 0\})$$

The single MAP detector embodiment may be a more flexible design than the parallel MAP detector embodiment for achieving higher performance with higher complexity, beyond the examples described in detail. However, storing all the quarter-rate branch metrics and the more complex combined metric make the single detector described by FIGS. 11 and 12 slightly larger than the two parallel MAP detectors described in FIGS. 8 and 9. The two detailed embodiments have similar performance.

CONCLUSION

While exemplary embodiments of the present invention have been described with respect to digital logic blocks, as would be apparent to one skilled in the art, various functions may be implemented in the digital domain as processing steps in a software program, in hardware by circuit elements of state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

We claim:

1. A soft output channel detector for processing a received signal comprised of a plurality data samples and generating log-likelihood ratios for a sequence of said data samples associated with N consecutive bits per clock cycle, comprising:
   a plurality, D, of maximum a posteriori (MAP) detectors operating in parallel, wherein each MAP detector processes a plurality of branch metrics, wherein said plurality of branch metrics are based on substantially the entire sequence of said data samples and generates a corresponding log-likelihood ratio for at least one symbol associated with N consecutive bits, wherein N is greater than or equal to D.

2. The soft output channel detector of claim 1, further comprising means for merging said log-likelihood ratio values to form an output sequence.

3. The soft output channel detector of claim 1, wherein N is four and D is two, and wherein each of said two MAP detectors generates two log-likelihood ratio values per quarter-rate clock cycle.

4. The soft output channel detector of claim 1, wherein each MAP detector calculates combined metrics for transitions in a set of current transitions and the MAP detector that generates the log-likelihood ratios for a given symbol has all possible values for that symbol constrained in the set of current transition labels.

5. The soft output channel detector of claim 4, wherein the log-likelihood ratio for a given value of a symbol is the difference between a best combined metric and a best combined metric out of current transitions with that particular symbol value.

6. The soft output channel detector of claim 4, wherein a first of said MAP detectors constrains two consecutive bits out of four bits and a second of said MAP detectors constrains an additional two out of said four bits.

7. The soft output channel detector of claim 6, wherein a first MAP detector determines a log-likelihood ratio value for two out of said four bits and a second MAP detector determines a log-likelihood ratio value for an additional two out of said four bits.

8. The soft output channel detector of claim 6, wherein said first and second MAP detectors are offset by two bits and wherein a branch metric input to said second MAP detector is delayed by two bits from said first MAP detector.

9. The soft output channel detector of claim 1, wherein a backward detector that calculates backward state metrics starts from all zero state metrics and is unraveled to represent a best metric path leaving a current trellis state in the forward direction.

10. The soft output channel detector of claim 9, wherein a forward detector calculates a best metric path leading to a forward state at time k, and combined metrics for states at time k-Q are formed by adding a delayed forward metric leading to a state at time k-Q with a backward metric representing a best metric path of length Q leaving the said state at time k-Q in the forward direction.

11. The soft output channel detector of claim 1, wherein a complexity of said channel detector is reduced by removing a dependence on one or more bits in a metric.

12. The soft output channel detector of claim 11, wherein said dependence on one or more bits is removed by selecting the value of the bits that corresponds to a best metric.

13. The soft output channel detector of claim 1, wherein bits that are not constrained by a state are selected based on one or more of feedback and a best metric.

14. The soft output channel detector of claim 1, wherein the symbols are mapping of one or more detected bits.

15. The soft output channel detector of claim 13, wherein the mapping is $(1 \oplus D)$.

16. The method of claim 1, wherein a backward detector that calculates backward state metrics has fewer states than a forward detector that calculates forward state metrics.

17. The method of claim 1, wherein one or more branches in a trellis processed by said MAP detectors corresponds to more than one bit per branch.

18. A method for processing a received signal comprised of a plurality data samples and for generating log-likelihood ratios for a sequence of said data samples associated with N consecutive bits per clock cycle, comprising:
generating log-likelihood ratios for symbols associated with N consecutive bits per clock cycle using a plurality, D, of maximum a posteriori (MAP) detectors operating in parallel, wherein each MAP detector processes a plurality of branch metrics, wherein said plurality of branch metrics are based on substantially the entire sequence of said data samples and generates a corresponding log-likelihood ratio for at least one symbol associated with N consecutive bits, wherein N is greater than or equal to D.

19. The method of claim 18, wherein a backward detector that calculates backward state metrics starts from all zero state metrics and is unraveled to represent a best metric path leaving a current trellis state in the forward direction.

20. The method of claim 19, wherein each clock cycle N samples are received, full-rate branch metrics with $2^S$ states are calculated for each sample and shared with all the detectors, where S is the channel memory length, and the $i^{th}$ MAP detector in the plurality of D parallel MAP detectors, with $0 \leq i \leq D-1$, calculates soft-output associated with N/D consecutive bits and comprises a forward detector for a radix $2^N$ trellis with $2^F$ states at time k=jN−iN/D, where j is an index associated with an input clock cycle and the number of bits in the state label is F, with $S \geq F \geq N/D$, and
the backward detector in the MAP detector with index i=0 in the plurality of D parallel MAP detectors selects $2^S$ best N-step backward path metrics leaving each of the $2^S$ states at time (j−1)N in the forward direction.

21. The method of claim 20, wherein N is four and D is two, wherein each of said two MAP detectors generates two log-likelihood ratio values per quarter-rate clock cycle.

\* \* \* \* \*

UNITED STATES PATENT AND TRADEMARK OFFICE
CERTIFICATE OF CORRECTION

PATENT NO. : 8,711,984 B2  Page 1 of 1
APPLICATION NO. : 12/017765
DATED : April 29, 2014
INVENTOR(S) : Kelly K. Fitzpatrick and Erich F. Haratsch It is certified that error appears in the above-identified patent and that said Letters Patent is hereby corrected as shown below:

In the Specification
Column 3, line 59, replace "detectors" with --detector--.
Column 4, line 14, replace "fox" with --for--.
Column 5, line 6, replace "Four-Stare Max-Log MAP Algorithm" with -- Four-State Max-Log MAP Algorithm--.
Column 11, line 9, replace "number of states and/or different local feedback)" with --number of states and/or different local feedback).--.
Column 11, line 67, replace "1160 FIG. 12" with --1160. FIG. 12--.

In the Claims
Column 13, line 3, claim 4, replace "transitions and the MAP" with --transitions, and the MAP--.
Column 14, line 5, claim 16, replace "method" with --soft output channel detector of claim 1--.
Column 14, line 8, claim 17, replace "method" with --soft output channel detector of claim 1--.

Signed and Sealed this
Seventeenth Day of February, 2015

Michelle K. Lee
*Deputy Director of the United States Patent and Trademark Office*